(12) United States Patent
Scully et al.

(10) Patent No.: US 6,782,020 B2
(45) Date of Patent: Aug. 24, 2004

(54) INFRARED GENERATION IN SEMICONDUCTOR LASERS

(75) Inventors: Marlan O. Scully, Bryan, TX (US); Alexey A. Belyanin, College Station, TX (US); Vitaly V. Kocharovsky, College Station, TX (US); Vladimir V. Kocharovsky, Nizny Novgorod (RU)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 09/950,458

(22) Filed: Sep. 10, 2001

(65) Prior Publication Data

US 2002/0041610 A1 Apr. 11, 2002

Related U.S. Application Data

(60) Provisional application No. 60/231,487, filed on Sep. 8, 2000.

(51) Int. Cl.[7] ............................... H01S 5/00; H01S 3/30
(52) U.S. Cl. ............................... 372/45; 372/4; 372/21; 372/39; 372/43
(58) Field of Search ............................... 372/4, 21, 39, 372/43, 45

(56) References Cited

U.S. PATENT DOCUMENTS

| | | | | |
|---|---|---|---|---|
| 5,300,789 A | * | 4/1994 | Gorfinkel et al. | 257/21 |
| 5,799,026 A | * | 8/1998 | Meyer et al. | 372/45 |
| 5,898,720 A | * | 4/1999 | Yamamoto et al. | 372/39 |
| 6,404,791 B1 | * | 6/2002 | Yang | 372/45 |
| 6,501,783 B1 | * | 12/2002 | Capasso et al. | 372/43 |

OTHER PUBLICATIONS

Chui, H.C. et al., "Tunable Mid–Infrared Generation by Mixing of Near–Infrared Wavelengths in Intersubband Quantum Wells" Oct. 3–Nov. 3, 1994, LEOS '94 Conference Proceedings. IEEE, vol. 1, 175–176.*

*Possibility of the Amplification of Electromagnetic Waves in a Semiconductor With a Superlattice*, R. F. Kazarinov and R. A. Suris, Soviet Physics—Semiconductors, vol. 5, No. 4, Oct. 1971, pp. 707–709.

*Quantum Cascade Laser*, Jerome Faist, Federico Capasso, Deborah L. Sivco, Carlo Sirtori, Albert L. Hutchinson, Alfred Y. Cho, SCIENCE, vol. 264, Apr. 22, 1994, pp. 553–556.

*Possibility of Room Temperature Intra–Band Lasing in Quantum Dot Structures Placed in High–Photon Density Cavities*, Jasprit Singh, IEEE Photonics Technology Letters, vol. 8, No. 4, Apr. 1996, pp. 488–490.

Optics & Photonics News, Oct. 1999, Society of America, pp. 32–37.

(List continued on next page.)

Primary Examiner—Don Wong
Assistant Examiner—Cornelius H Jackson
(74) Attorney, Agent, or Firm—Baker Botts L.L.P.

(57) ABSTRACT

Infrared generation is disclosed. A first laser field having a first frequency associated with a first interband transition is generated. A second laser field having a second frequency associated with a second interband transition is generated. The generation of the first laser field occurs substantially simultaneously with the generation of the second laser field. A third laser field is generated from the first laser field and the second laser field. The third laser field has a third frequency associated with an intersubband transition. The third frequency is substantially equivalent to a difference between the second frequency and the first frequency.

26 Claims, 3 Drawing Sheets

OTHER PUBLICATIONS

*Lasers without Inversion: Interference of Lifetime–Broadened Resonances*, S. E. Harris, Physical Review Letters, vol. 62, No. 9, Feb. 27, 1989, pp. 1033–1036.

*Coherent amplification of an ultrashort pulse in a three–level medium without a population inversion*, O.A. Kocharovskaya and Ya. I. Khanin, Institute of Applied Physics, Academy of Sciences of the USSR, JETP Lett., vol. 48, No. 11, Dec. 10, 1988, pp. 631–635.

*Degenerate Quantum–Beat Laser: Lasing without Inversion and Inversion without Lasing*, Marlan O. Scully and Shi–Yao Zhu, Physical Review Letters, vol. 62, No. 24, Jun. 12, 1989, pp. 2813–2816.

*Amplification and lasing without inversion*, Olga Kocharovskaya, Physics Reports, Elsevier Science Publishers B.V., 1992, pp. 175–190.

*Semiconductor lasers without population inversion*, A. Imamoglu and R. J. Ram, Optics Letters, vol. 19, No. 21, Nov. 1, 1994, pp. 1744–1746.

*Quantum Interference in Semiconductor Quantum Wells*, H. Schmidt, D.E. Nikonov, K. L. Campman, K. D. Maranowski, A. C. Gossard, and A. Imamoglu, Lasing Without Inversion and Interference Phenomena in Atomic Systems, Laser Physics, vol. 9, No. 4, 1999, pp. 797–812.

*Coherent population trapping in cesium: Dark lines and coherent microwave emission*, Jacques Vanier, Aldo Godone, and Filippo Levi; Physical Review A, vol. 58, No. 3, Sep. 1998; pp. 2345–2358.

*Widely separate wavelength switching of single quantum well laser diode by injection–current control*, Yasunori Tokuda, Noriaki Tsukada, Kenzo Fujiwara, Koichi Hamanaka, and Takashi Nakayama, Appl. Phys. Lett. 49 (24), Dec. 15, 1986, 1986 American Institute of Physics, pp. 1629–1631.

*Second quantized state oscillation and wavelength switching in strained–layer multiquantum–well lasers*, T. R. Chen, Yuhua Zhuang, Y.J. Xu, B. Zhao, and A. Yariv, J. Ungar, Se Oh, Appl. Phys. Lett 60 (24), Jun. 15, 1992, 1992 American Insitute of Physics, pp. 2954–2956.

*Intraband Relaxation Time in Quantum–Well Lasers*, Masahiro Asada, IEEE Journal of Quantum Electronics, vol. 25, No. 9, Sep. 1989, pp. 2019–2026.

*Density dependence of carrier–carrier–induced intersubband scattering in GaAs/$Al_xGa_{1-x}$As quantum wells*, M. Hartig, J.D. Ganiere, P.E. Selbmann, and B. Deveaud; Physical Review B, vol. 60, No. 3, Jul. 15, 1999–1, The American Phyisical Society, pp. 1500–1503.

*Low–loss Al–free waveguides for unipolar semiconductor lasers*; C. Sirtoli, P. Kruck, S. Barbieri, H. Page, J. Nagle, M. Beck, J. Faist, U. Oesterie, Applied Physics Letters, vol. 75, No. 25, Dec. 20, 1999, 1999 American Institute of Physics, pp. 3911–3913.

PTC Notification of Transmittal of the International Search Report or the Declaration, mailed Aug. 16, 2002, including International Search Report re PCT/US 01/28289 (6 pgs).*

Kastalsky, A, "Infrared Intraband Laser Induced in a Multiple–Quantum–Well Interband Laser," *IEEE Journal of Quantum Electronics*, IEEE Inc. NY, vol. 29 #4, pp. 1112–1115, Apr. 1993.*

Spencer, et al., "Quantum Well Structures for Intersubband Semiconductor Lasers," *International Journal of Optoelectronics* (Incl. Optical Computing & Processing), London G.B., vol. 10, No. 5, pp. 393–400, Sep. 1995.*

Petrov, et al., "Widely Tunable Continuous–Wave Mid–Infrared Laser Source Based on Difference–Frequency Generation in AGGAS2," *Applied Optics*, Optical Society of America, Washington, US, pp. 4925–4928, Jul. 1998.*

Belyanin, et al., "Infrared Generation in Low–Dimensional Semiconductor Heterostructures Via Quantum Coherence," *Physical Review* (Atomic, Molecular and Optical Physics), vol. 63, #5, pp. 053803/1–8, May 2001.*

* cited by examiner

INFRARED GENERATION IN SEMICONDUCTOR LASERS

RELATED APPLICATION

This application claims benefit under 35 U.S.C. § 119(e) of U.S. Provisional Application Ser. No. 60/231,487, filed Sep. 8, 2000, entitled "METHOD AND SYSTEM FOR INFRARED GENERATION."

TECHNICAL FIELD OF THE INVENTION

This invention relates generally to the field of lasers and more specifically to infrared generation in semiconductor lasers.

BACKGROUND OF THE INVENTION

Some infrared semiconductor lasers use bipolar injection pumping and are based on narrow band-gap materials such as lead salts. These lasers, however, are usually less robust and less reliable than their shorter-wavelength counterparts based on GaAs or InP. Other infrared semiconductor lasers operate on intersubband, rather than interband transitions and have a unipolar (n-type) design. Intersubband lasers are based on InP or GaAs technology. These lasers, however, suffer from problems stemming from the need to maintain a large population of carriers on a very short-lived excited level. One problem is that a large pumping current may be needed to support laser operation, which may lead to overheating. As a result, these lasers typically operate in a pulsed manner or continuously only if significantly cooled. The second problem is that strong non-resonant losses of the infrared radiation are caused by free-carrier absorption and diffraction, which increase sharply at longer wavelengths. Consequently, it is difficult for semiconductor lasers to overcome losses for wavelengths above approximately 30 microns.

SUMMARY OF THE INVENTION

In accordance with the present invention, a method and device for infrared generation are provided that substantially eliminate or reduce the disadvantages and problems associated with previously developed devices and methods.

According to one embodiment of the present invention, infrared generation is disclosed. A first laser field having a first frequency associated with a first interband transition is generated. A second laser field having a second frequency associated with a second interband transition is generated. The generation of the first laser field occurs substantially simultaneously with the generation of the second laser field. A third laser field is generated from the first laser field and the second laser field. The third laser field has a third frequency associated with an intersubband transition. The third frequency is substantially equivalent to a difference between the second frequency and the first frequency.

A technical advantage of one embodiment of the present invention may be that infrared generation is achieved without population inversion on the operating intraband transition. This is achieved with the aid of laser fields simultaneously generated on the interband transitions, which serve as the coherent drive for the frequency down-conversion to the infrared region.

A technical advantage of another embodiment may be that the embodiment employs drive fields that are self-generated in the same laser cavity, instead of using external drive fields. This eliminates problems associated with an external drive such as beam overlap, drive absorption, and spatial inhomogeneity problems.

A technical advantage of another embodiment may be the enhancement of nonlinear wave mixing near a resonance with an intersubband transition. The efficiency of wave mixing increases with approaching resonance inversely proportional to the detuning from resonance and reaches the limiting quantum efficiency corresponding to one infrared photon per one drive field photon.

A technical advantage of another embodiment may be the cancellation of resonance one-photon absorption for the generated infrared radiation due to coherence effects provided by self-generated drive fields. This happens when two-photon stimulated processes prevail over one-photon absorption.

Other technical advantages are readily apparent to one skilled in the art from the following figures, descriptions, and claims. Embodiments of the invention may include none, some, or all of the technical advantages.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
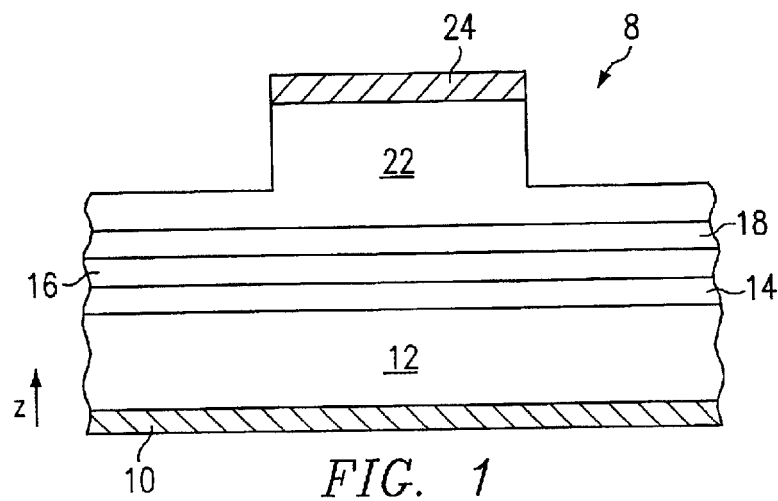
FIG. 1 illustrates a cross-section of one embodiment of a device for infrared generation.

FIG. 1 illustrates a cross-section of one embodiment of a device 8 for infrared generation comprising a semiconductor laser device. In general, generation of infrared radiation occurs in an active region 16 as a result of nonlinear mixing of two laser fields generated substantially simultaneously in active region 16.

Device 8 may include an n-contact layer 10. N-contact layer 10 may comprise a conductive material such as a metal of a thickness of approximately 0.1 to 1 micrometers. A mid/far-infrared waveguide layer 12 may be disposed outwardly from n-contact layer 10. Mid/far-infrared waveguide layer 12 may comprise a semiconductive material such as GaAs deposited to a thickness of approximately 1 to 3 micrometers. A near-infrared waveguide layer 14 may be disposed outwardly from mid/far-infrared waveguide layer 12. Near-infrared waveguide layer 14 may comprise a semiconductive material such as AlGaAs deposited to a thickness of approximately 0.5 to 1.5 micrometers. Near-infrared wavelengths may comprise wavelengths of approximately 0.7 to two microns, middle-infrared wavelengths may comprise wavelengths of approximately two to ten microns, and far-infrared wavelengths may comprise wavelengths of approximately ten to 100 microns Active region 16 may be disposed outwardly from near-infrared waveguide layer 14. Active region 16 may comprise a number of undoped layers of quantum wells or quantum dots. Active region 16 is described in more detail with reference to FIGS. 3, 5, and 6. A near-infrared waveguide layer 18 may be disposed outwardly from active region 16. Near-infrared waveguide layer 18 may comprise a semiconductive material such as AlGaAs deposited to a thickness of approximately 0.5 to 1.5 micrometers. A mid/far-infrared waveguide layer 22 may be disposed outwardly from near-infrared waveguide layer 18. Mid/far-infrared waveguide layer 22 may comprise a semiconductive material such as GaAs deposited to a thickness of approximately 1 to 3 micrometers.

P-contact layer 24 may be disposed outwardly from mid/far-infrared waveguide layer 22, and may comprise a conductive material such as a metal deposited to a thickness of approximatey 0.1 to 1 micrometers. The layers of device 8 may be formed in a z-direction generally indicated in FIG. 1.

Near-infrared waveguide layers 14 and 18 may serve as an optical waveguide for optical laser fields, for example, red and infrared fields, generated on the interband transitions in active region 16. Mid/far-infrared waveguide layers 12 and 22 may form a mid/far-infrared waveguide for a mid/far-infrared mode. P-contact layer 24 and n-contact layer 10 may provide an injection of electrons and holes into active region 16 under an applied voltage bias of positive polarity to p-contact layer 24 and negative polarity to n-contact layer 10.

Device 8 may provide for separation of optical laser fields and mid/far-infrared laser fields. By independently varying the thickness and composition of near-infrared waveguide layers 14 and 18 that form the optical waveguide and mid/far-infrared waveguide layers 12 and 18 that form the mid/far-infrared waveguide, the effective refractive indices of the optical and mid/far-infrared modes may be adjusted. The adjustment may provide phase matching for modes participating in the nonlinear mixing process.

Phase matching may also be performed by selecting different types of transverse modes of the optical waveguide. Modes may be selected by introducing a thin absorption layer in the antinode of the mode to be suppressed. Since different transverse modes have different phase velocities, suppressing unwanted modes and picking up modes with desired phase velocities may provide for phase matching.

Figure 2:
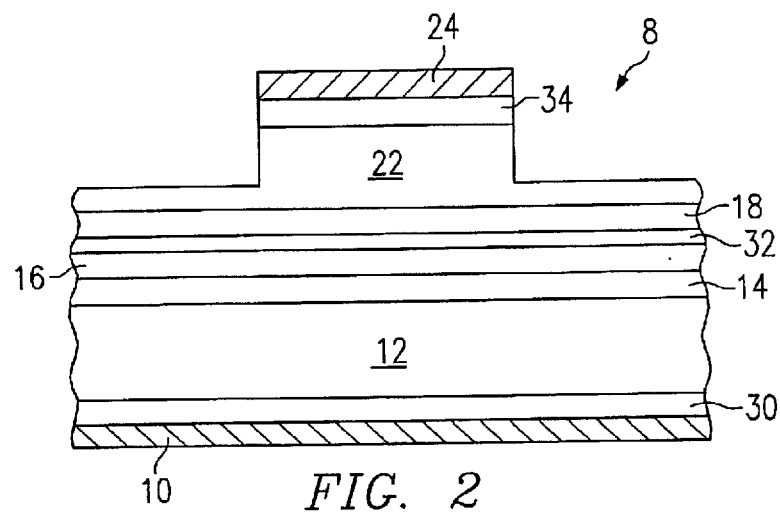
FIG. 2 illustrates one example of the device of FIG. 1.

FIG. 2 illustrates one example of device 8 of FIG. 1. An n-conductive layer 30 may be disposed outwardly from n-contact conductive layer 10. N-conductive layer 30 may comprise heavily doped n+GaAs of a thickness of approximately 0.3 to 0.7 micrometers. Mid/far-infrared waveguide layer 12 may comprise n-GaAs of approximately 2.8 micrometers. Near-infrared waveguide layer 14 may comprise doped n-$Al_{0.47}Ga_{0.53}As$ of a thickness of approximately 0.75 micrometers.

Active region 16 may comprise, for example, approximately five to ten periods of AlGaAs/GaAs quantum wells, which are described in more detail in connection with FIGS. 3 and 5. An absorption layer 32 may be disposed outwardly from active region 16, and may comprise $Al_{0.12}Ga_{0.88}As$ of a thickness of approximately 0.02 micrometers. Near-infrared waveguide layer 18 may comprise p-$Al_{0.47}Ga_{0.53}As$ of a thickness of approximately 0.75 micrometers. Mid/far-infrared waveguide layer 22 may comprise p-GaAs of a thickness of approximately 1.2 micrometers. A p-conductive layer 34 may be disposed outwardly from mid/far-infrared waveguide layer 22 and may comprise heavily doped p+GaAs.

Near-infrared waveguide layers 14 and 18 provide an optical waveguide that supports generation of a fundamental transverse mode ($TE_0$) of a first laser field that is associated with transition 2-1 described in connection with FIG. 3, and increases losses for the $TE_0$ mode of a second laser field that is associated with transition 3-1 described in connection with FIG. 3, knocking the latter mode out of generation. As a result, only the first-order transverse mode ($TE_1$) of a second laser field is generated, which may be better phase-matched to the first laser mode.

Figure 3:
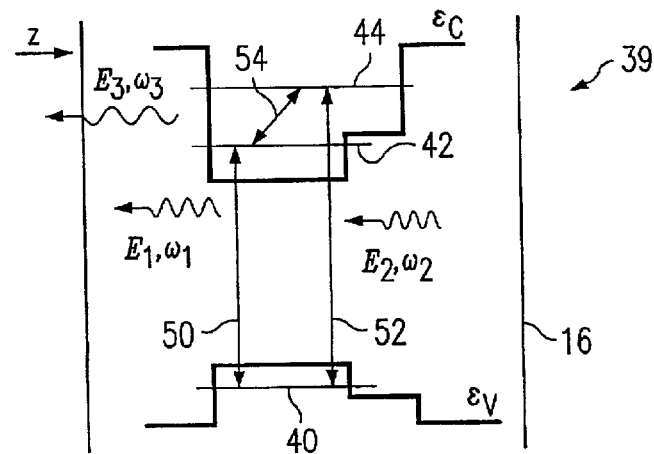
FIG. 3 is a band alignment diagram illustrating one period of an example quantum well of an active region.

FIG. 3 is a generic band alignment diagram illustrating one period of an example quantum well 39 of active region 16. The diagram shows an edge energy of the conduction band $\epsilon_c$ and an edge energy of the valence band $\epsilon_v$ of a heterostructure, an edge energy 40 representing state 1 of a first subband of heavy holes in a valence band, and edge energies 42 and 44 representing states 2 and 3, respectively, of first and second subbands, respectively, of electrons in a conduction band. The z-direction is indicated generally in FIG. 3.

A first laser field $E_1$ 50 at frequency $\Phi_1$ associated with a first interband transition 2-1 from state 2 to state 1 and a second laser field $E_2$ 52 at frequency $\omega_2$ associated with a second interband transition 3-1 from state 3 to state 1 generate an infrared field $E_3$ 54 as a result of nonlinear wave mixing at a frequency $\omega_3=\omega_2-\omega_1$ substantially equal to the difference of frequencies of two laser fields $E_1$ and $E_2$. The stepped profile of the confinement potential of quantum well 39 may make the transition 3-1 allowed by selection rules.

In the illustrated example, infrared frequency $\omega_3$ is close to the frequency of intersubband transition 3-2 between the two electron subbands in the conduction band. The infrared frequency $\omega_3$, however, may be close to the frequency of the intersubband transition between the two hole subbands in the valence band.

Figure 4:
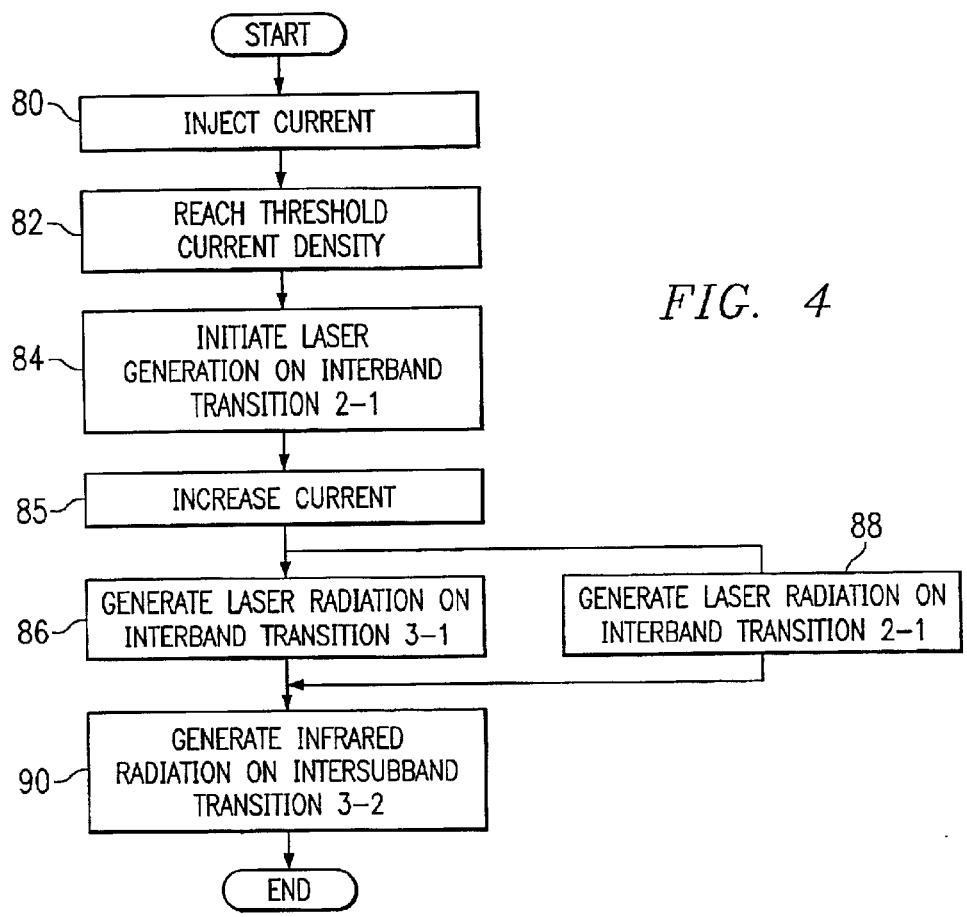
FIG. 4 is a flowchart illustrating one embodiment of a method for infrared generation.

FIG. 4 is a flowchart illustrating one embodiment of a method for infrared generation. The method starts at step 80, where a current of approximately 100 milliamps is injected into device 8. When the injection current density J reaches a certain threshold value $J_{th}$ of approximately 100 to 300 amps per square centimeter at step 82, generation of optical laser fields is initiated at step 84 due to recombination transitions between ground electron state 2 and ground hole state 1. The current is increased at step 85. An optical laser field is generated from an excited electron state 3 and the ground hole state 1 at step 86. Generation of the optical field from ground electron state 2 and ground hole state 1 is continued at step 88. With optimized laser parameters, the region of simultaneous ground-state and excited-state lasing corresponds to the current J of order 2 $J_{th}$.

In the presence of two strong laser fields on the transitions 2-1 and 3-1, an infrared field on the transition 3-2 is generated at step 90 as a result of nonlinear mixing without population inversion on the intersubband transition 3-2. The threshold current may be decreased to achieve continuous laser generation in the mid-infrared range to the far-infrared range at room temperature of approximately 295 to 305 degrees Kelvin, for example, 300 degrees Kelvin.

The embodiment may provide inversionless mid/far-infrared laser generation as a result of nonlinear mixing of two strong optical fields. The laser field may be enhanced near the resonance between the difference frequency of two optical fields and the frequency of the intersubband transition. An advantage of the method may be that the optical fields are intracavity-generated on the interband transitions in the same injection-pumped semiconductor laser, which may reduce numerous compatibility problems associated with an external laser pump and may increase an output infrared power up to approximately 100 mW.

Figure 5:
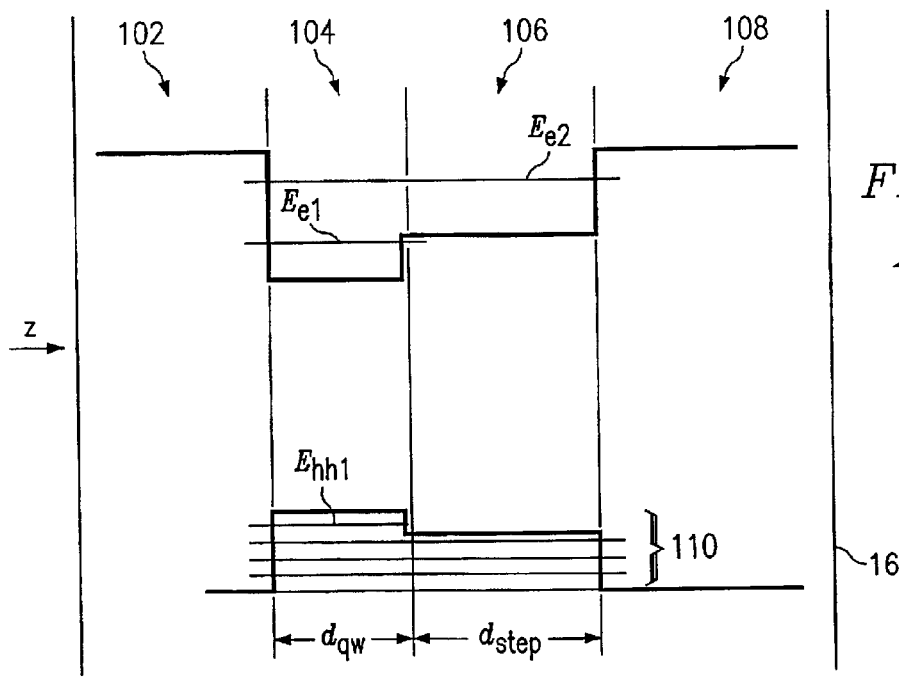
FIG. 5 is a band alignment diagram illustrating one period of another example quantum well.

FIG. 5 is a band alignment diagram illustrating one well period of a quantum well 39 of FIG. 3 based on AlGaAs/GaAs heterostructures. Quantum well 39 comprises layers 102 through 108. A barrier layer 102 may comprise, for example, $Al_{0.35}Ga_{0.65}As$ deposited to a thickness of approximately 10 to 30 nanometers. A semiconductive layer 104 may comprise, for example, $GaAs/Al_{0.12}Ga_{0.88}As$ deposited to a thickness of approximately $d_{qw}$=2.8 nanometers, and semiconductive layer 106 may comprise $GaAs/Al_{0.12}Ga_{0.88}As$ deposited to a thickness of approximately $d_{step}$=3.4 nanometers. A barrier layer 108 may comprise $Al_{0.35}Ga_{0.65}As$ deposited outwardly from semiconductive layer 106 to a thickness of approximately 10 to 30 nanometers. Barrier layers 102 and 108 and semiconductive layers 104 and 106 may be undoped.

Semiconductive layers 104 and 106 may form a stepped potential well for electrons and holes with barrier layers 102 and 108. The diagram illustrates edge energies $E_{e1}$, $E_{e2}$, $E_{hh1}$ of the first two electron subbands e1 and e2 and the first heavy-hole subband hh1, respectively. Energies $E_{hh1-e1}$, $E_{hh1-e2}$, $E_{e1-e2}$ correspond to the three transitions between the electron subbands e1 and e2 and the heavy-hole subband hh1. Energy $E_{hh1-e1}$ may be approximately 1.571 eV, energy $E_{hh1-e2}$ may be approximately 1.721 eV, and energy $E_{e1-e2}$ may be approximately 0.150 eV. In the illustrated example, other subbands 110 of holes in the valence band do not participate in generation. In active region 16 that includes a number of quantum wells 39 of FIG. 5, laser generation may occur in the mid-infrared range around 9 microns.

Figure 6:
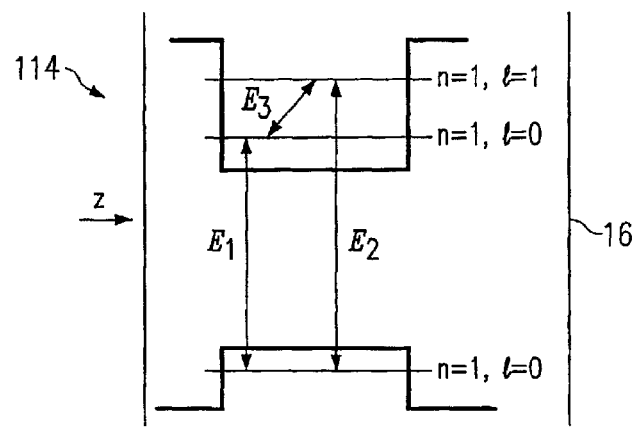
FIG. 6 is a band alignment diagram illustrating an example of a quantum dot of an active region.

FIG. 6 is a band alignment diagram illustrating an example of a quantum dot 114 of active region 16. The diagram illustrates the quantum numbers of states 1, 2, and 3 involved in the infrared generation. In the case of quantum dots, the three transitions are allowed by selection rules because the transitions occur between the states 1, 2, and 3 with the same principal quantum number n, but with different orbital quantum numbers l. This allows use of a symmetric potential as shown in FIG. 6.

Figure 7:
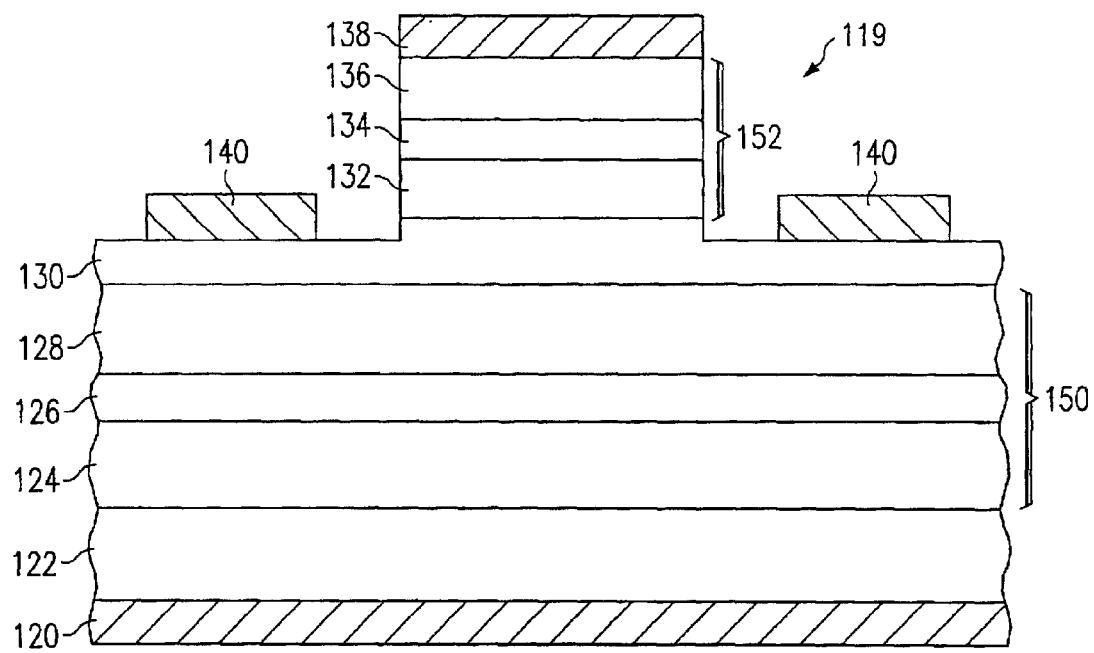
FIG. 7 illustrates a cross-section of another embodiment of a device for infrared generation.

FIG. 7 illustrates a cross-section of one example of a device 119 for infrared generation using a p-n-p transistor scheme. A p-contact layer 120 may be substantially similar to p-contact layer 24. A p+ substrate 122 disposed outwardly from p-contact layer 120 may comprise a heavily p-doped semiconductive material such as GaAs of a thickness of approximately 5 to 50 micrometers. A first laser field generator 150 may comprise a number of first wavelength waveguide layers 124 and 128 and active region 126. First wavelength waveguide layer 124 may be disposed outwardly from p+substrate 122, an active region 126 may be disposed outwardly from first wavelength waveguide layer 124, and first wavelength waveguide layer 128 may be disposed outwardly from active region 126. First wavelength waveguide layers 124 and 128 may be substantially similar to near-infrared waveguide layers 14 and 18, and active region 126 may be substantially similar to active region 16.

An n+ gate layer 130 may be disposed outwardly from first wavelength waveguide layer 128, and may comprise an n+ doped semiconductive layer of a thickness of approximately 0.5 to 1.5 micrometers. A second laser field generator 152 may comprise a number of second wavelength waveguide layers 132 and 136 and active region 134. Second wavelength waveguide layer 132 may be disposed outwardly from n+ gate layer 30, an active region 134 may be disposed outwardly from second wavelength waveguide layer 132, and second wavelength waveguide layer 136 may be disposed outwardly from active region 134. Second wavelength waveguide layers 132 and 136 may be substantially similar to near-infrared waveguide layers 14 and 18, and active region 134 may be substantially similar to active region 16.

N-contact regions 140 may be disposed outwardly from n+ gate layer 130, and may be substantially similar to n-contact layer 10. P-contact layer 138 may be disposed outwardly from second wavelength waveguide layer 136, and may be substantially similar to p-contact layer 120.

Optical (red or near-infrared) laser fields at a first wavelength $\lambda_1$ and a second wavelength $\lambda_2$ are generated in active regions 126 and 134 and are overlapped in an overlap region located at one of the active regions 126 and 134 or in between active regions 126 and 134. The extent of overlap depends on the transverse profiles of the optical modes and may be adjusted by varying the composition and thickness of the first wavelength waveguide layers 124 and 128 for the mode at wavelength $\lambda_1$ and second wavelength waveguide layers 132 and 134 for the mode at wavelength $\lambda_2$.

A three-contact p-n-p transistor scheme of injection current pumping may allow for independent control of the drive field intensities. The voltages between the n-doped gate layer 130 coupled to n-contact regions 140 on the one hand, and p-contact layers 120 and 138 disposed on opposing sides on the other hand, may be adjusted independently. This may allow for independent control of the injection currents through active regions 126 and 134, thus providing for control of the intensities of two optical field modes.

Although embodiments of the invention and their advantages are described in detail, a person skilled in the art could make various alterations, additions, and omissions without departing from the spirit and scope of the present invention as defined by the appended claims.

What is claimed is:

1. A method for infrared generation, comprising:

generating a first laser field having a first frequency associated with a first interband transition of a heterostructure;

generating a second laser field having a second frequency associated with a second interband transition of the heterostructure, the generation of the first laser field occurring substantially simultaneously with the generation of the second laser field; and generating a third laser field by nonlinear mixing of both the first laser field and the second laser field, the third laser field having a third frequency associated with an intersubband transition of the heterostructure, the third frequency substantially equivalent to a difference between the second frequency and the first frequency.

2. The method of claim 1, wherein generating a third laser field by nonlinear mixing of both the first laser field and the second laser field comprises generating a laser field from a state difference between the first interband transition and the second interband transition.

3. The method of claim 1, wherein:

the first interband transition corresponds to a first transition from a first ground electron state to a ground hole state;

the second interband transition corresponds to a second transition from an excited electron state to the ground hole state; and the intersubband transition corresponds to a third transition from the excited electron state to the ground electron state.

4. The method of claim 1, wherein:
   generating the first laser field comprises injecting a current through a first waveguide comprising aluminum gallium arsenide; and
   generating the second laser field comprises injecting the current through a second waveguide comprising gallium arsenide.

5. The method of claim 1, wherein:
   the first laser field has a first wavelength of approximately 0.7 to two microns; and
   the second laser has a second wavelength of approximately ten to 100 microns.

6. The method of claim 1, further comprising generating the third laser field at a temperature of approximately 295 to 305 degrees Kelvin.

7. The method of claim 1, wherein generating the third laser field comprises generating the third laser field at an active region comprising a plurality of quantum wells.

8. The method of claim 1, wherein generating the third laser field comprises generating the third laser field at an active region comprising a plurality of quantum dots.

9. A device for infrared generation, comprising:
   a first waveguide adapted to generate a first laser field having a first frequency associated with a first interband transition of a heterostructure;
   a second waveguide coupled to the first waveguide and adapted to generate a second laser field having a second frequency associated with a second interband transition of the heterostructure, the generation of the first laser field occurring substantially simultaneously with the generation of the second laser field; and
   an active region coupled to the first waveguide and adapted to generate a third laser field from nonlinear mixing of the first laser field and the second laser field, the third laser field having a third frequency associated with an intersubband transition of the heterostructure, the third frequency substantially equivalent to a difference between the second frequency and the first frequency.

10. The device of claim 9, wherein the active region is adapted to generate the third laser field from a state difference between the first interband transition and the second interband transition.

11. The device of claim 9, wherein:
    the first interband transition corresponds to a first transition from a ground electron state to a ground hole state;
    the second interband transition corresponds to a second transition from an excited electron state to the ground hole state; and
    the intersubband transition corresponds to a third transition from the excited electron state to the ground electron state.

12. The device of claim 9, wherein:
    the first waveguide comprises a first waveguide layer comprising aluminum gallium arsenide; and
    the second waveguide comprises a second waveguide layer comprising gallium arsenide.

13. The device of claim 9, wherein:
    the first laser field has a first wavelength of approximately 0.7 to two microns; and
    the second laser has a second wavelength of approximately ten to 100 microns.

14. The device of claim 9, wherein the active region is adapted to generate the third laser field at a temperature of approximately 295 to 305 degrees Kelvin.

15. The device of claim 9, wherein the active region comprises a plurality of quantum wells.

16. The device of claim 9, wherein the active region comprises a plurality of quantum dots.

17. The device of claim 9, wherein:
    the first waveguide comprises a first near-infrared waveguide layer and a second near-infrared waveguide layer;
    the second waveguide comprises a first middle to far-infrared waveguide layer and a second middle to far-infrared waveguide layer;
    the first near-infrared waveguide layer is disposed outwardly from the first middle to far-infrared waveguide layer;
    the active region is disposed outwardly from the first near-infrared waveguide layer;
    the second near-infrared waveguide layer is disposed outwardly from the active region; and
    the second middle to far-infrared waveguide layer is disposed outwardly from the second near-infrared waveguide layer.

18. A device for infrared generation, comprising:
    a first laser field generator adapted to generate a first laser field having a first frequency associated with a first interband transition of a heterostructure;
    a second laser field generator disposed outwardly from the first laser field generator and adapted to generate a second laser field having a second frequency associated with a second interband transition of the heterostructure, the generation of the first laser field occurring substantially simultaneously with the generation of the second laser field; and
    an overlap region adapted to generate a third laser field from nonlinear mixing of the first laser field and the second laser field, the third laser field having a third frequency associated with an intersubband transition of the heterostructure, the third frequency substantially equivalent to a difference between the second frequency and the first frequency.

19. The device of claim 18, wherein the overlap region is adapted to generate the third laser field from a state difference between the first interband transition and the second interband transition.

20. The device of claim 18, wherein:
    the first interband transition corresponds to a first transition from a first ground electron state to a first ground hole state;
    the second interband transition corresponds to a second transition from a second ground electron state to a second ground hole state; and
    the intersubband transition corresponds to a third transition from an excited electron state to a ground electron state from a set consisting of the first ground electron state and the second ground electron state.

21. The device of claim 18, wherein:
    the first laser field generator comprises a first waveguide layer comprising aluminum gallium arsenide; and
    the second laser field generator comprises a second waveguide layer comprising aluminum gallium arsenide.

22. The device of claim 18, wherein:
    the first laser field has a first wavelength of approximately 0.7 to two microns;
    the second laser has a second wavelength of approximately 0.7 to two microns; and the third laser has a third wavelength of approximately ten to 100 microns.

23. The device of claim 18, wherein the overlap region is operable to generate the third laser field at a temperature of approximately 295 to 305 degrees Kelvin.

24. The device of claim 18, wherein the overlap region comprises a plurality of quantum wells.

25. The device of claim 18, wherein the overlap region comprises a plurality of quantum dots.

26. A method for infrared generation, comprising:

generating a first laser field by injecting a current through a first waveguide comprising aluminum gallium arsenide, the first laser field having a first frequency associated with a first interband transition corresponding to a first transition from a ground electron state to a ground hole state of a heterostructure, the first laser field has a first wavelength of approximately 0.7 to two microns;

generating a second laser field by injecting the current through a second waveguide comprising gallium arsenide, the second laser field having a second frequency associated with a second interband transition corresponding to a second transition from an excited electron state to the ground hole state of the heterostructure, the second laser has a second wavelength of approximately ten to 100 microns, the generation of the first laser field occurring substantially simultaneously with the generation of the second laser field; and generating a third laser field by a nonlinear mixing of the first laser field and the second laser field at a temperature of approximately 295 to 305 degrees Kelvin, the third laser field having a third frequency associated with an intersubband transition corresponding to a third transition from the excited electron state to the ground electron state of the heterostructure, the third frequency substantially equivalent to a difference between the second frequency and the first frequency.

* * * * *